United States Patent [19]

Van Roermund

[11] Patent Number: 4,502,019
[45] Date of Patent: Feb. 26, 1985

[54] DYNAMIC AMPLIFIER CIRCUIT

[75] Inventor: Arthur H. M. Van Roermund, Eindhoven, Netherlands

[73] Assignee: U.S. Philips Corporation, New York, N.Y.

[21] Appl. No.: 448,656

[22] Filed: Dec. 10, 1982

[30] Foreign Application Priority Data

Dec. 31, 1981 [NL] Netherlands ............... 8105919

[51] Int. Cl.³ ............................................. H03F 3/16
[52] U.S. Cl. ............................... 330/261; 330/51; 330/107; 330/253; 330/296
[58] Field of Search ............... 330/51, 107, 253, 257, 330/261, 296; 333/173; 307/296 A

[56] References Cited

FOREIGN PATENT DOCUMENTS 126303 10/1981 Japan ................... 330/253

Primary Examiner—James B. Mullins
Attorney, Agent, or Firm—Robert T. Mayer; Steven R. Biren

[57] ABSTRACT

A dynamic amplifier circuit, specifically for switched-capacitor filters, having a current source which supplies an exponentially-decreasing bias current. In addition, a current source is included for supplying an additional bias current in order to define the minimum bias current in the amplifier circuit.

2 Claims, 6 Drawing Figures

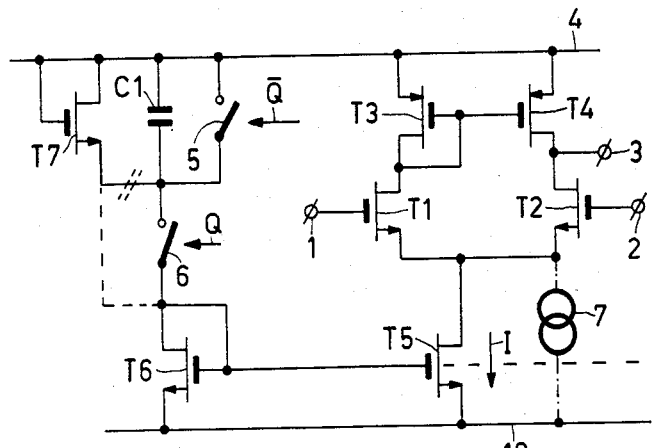
FIG.1a
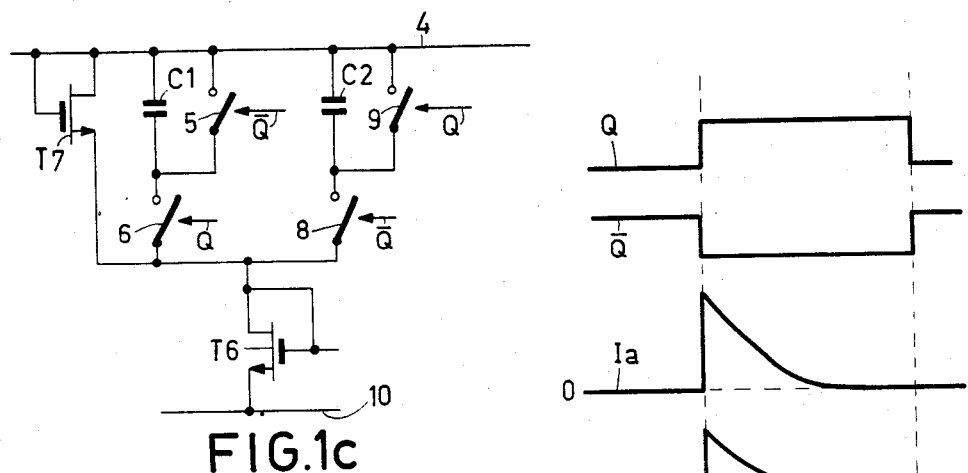
FIG.1c
FIG.1b
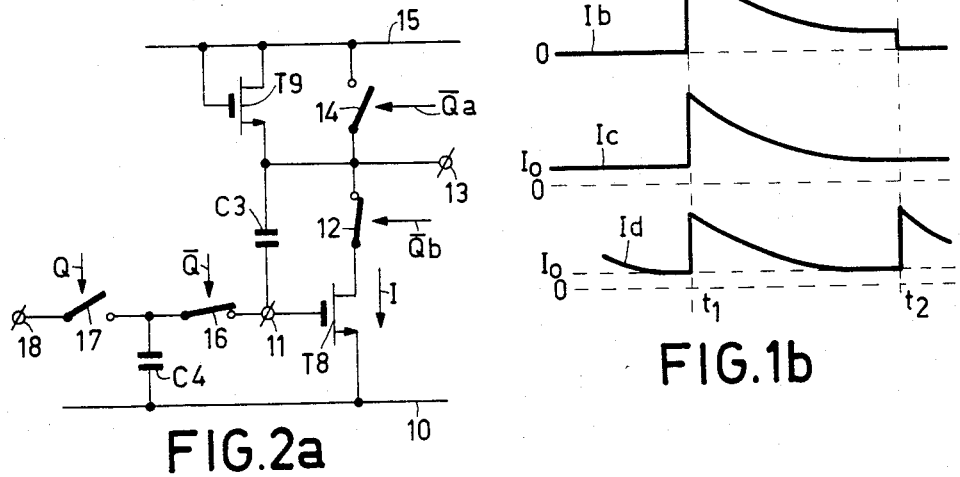
FIG.2a

DYNAMIC AMPLIFIER CIRCUIT

BACKGROUND OF THE INVENTION

The invention relates to a dynamic amplifier circuit for amplifying a signal in a first time interval, under control of a clock signal, which circuit comprises a bias circuit for obtaining a bias current in the amplifier circuit during said first time interval, which bias current decreases from an initial value. Such dynamic amplifier circuits are inter alia used in switched capacitor filter circuits in order to obtain the filter action and have been proposed in order to replace operational amplifiers in such circuits in inter alia:

Copeland, M. A. and Rabaey, J. M.: "Dynamic amplifier for M.O.S. technology", Electronics Letters, 1979, Vol. 15, No. 10, pages 301–302, Hosticka, B. J.: "Dynamic amplifiers in C.M.O.S. technology", Electronics Letters, 1979, Vol. 15, No. 25, pages 819–820, and Hosticka, B. J.: "Dynamic C.M.O.S. amplifiers" I.E.E.E. Journal of Solid-State Circuits, Vol. SC-15, No. 5, pages 887–894; which publications are herewith incorporated by reference.

The advantage of such a dynamic amplifier circuit is that at the beginning of the amplifying period, i.e. said first time interval, the bias current of the amplifier circuit is large, which means a high amplifier circuit speed at the beginning of the amplifying period, and that at the end of the amplifying period the bias current is small, which means a high gain and hence a high accuracy at the end of the amplifying period.

A switched-capacitance arrangement comprising such dynamic-amplifier circuits is found to be highly susceptible to interference, in particular at the end of the first time interval, when the bias current may be very small, and during a subsequent time interval in which the amplifier is turned off. Moreover, it has been found that such amplifier circuits present problems when a capacitance, for example the input capacitance of a following stage, is arranged between the outputs of two such dynamic amplifier circuits.

SUMMARY OF THE INVENTION

It is an object of the invention to provide a dynamic amplifier circuit of the type mentioned above, which does not have the disadvantages mentioned above. The invention is based on the recognition that these problems arise because the final value of the bias current is undefined, or the bias current even decreases to substantially zero and the amplifier no longer operates. This occurs within the first time interval unless the initial value of the decreasing bias current is made extremely high in view of the various parameter spreads and the relationship between the initial value and the final value, which is generally not desirable. The invention is characterized in that the bias circuit comprises an additional source for obtaining a current in the amplifier circuit, which current is substantially constant relative to said bias current and which has a comparatively small value relative to said initial value in order to define the minimum bias current in the amplifier circuit at the end of said time interval.

A dynamic amplifier circuit in accordance with the invention, in which the bias circuit comprises a switched capacitance which is switched in such a way that said capacitance is charged during a time interval preceding the first time interval and is discharged during the first time interval in order to obtain said variation, may further be characterized in that a current source is arranged in a circuit which is parallel to the circuit comprising the switched capacitance.

BRIEF DESCRIPTION OF THE DRAWINGS

The invention will be described in more detail, by way of example, with reference to the drawing, in which:

FIG. 1a shows a first embodiment of a dynamic amplifier circuit using the invention;

FIG. 1b shows some diagrams to explain the operation of the circuit shown in FIG. 1a;

FIG. 1c shows a modified part of the circuit shown in FIG. 1a;

FIG. 2a shows a second embodiment of a dynamic amplifier circuit using the invention;

FIG. 2b shows some diagrams to explain the operation of the amplifier circuit shown in FIG. 2a.

DESCRIPTION OF THE PREFERRED EMBODIMENTS

Figure 2B:
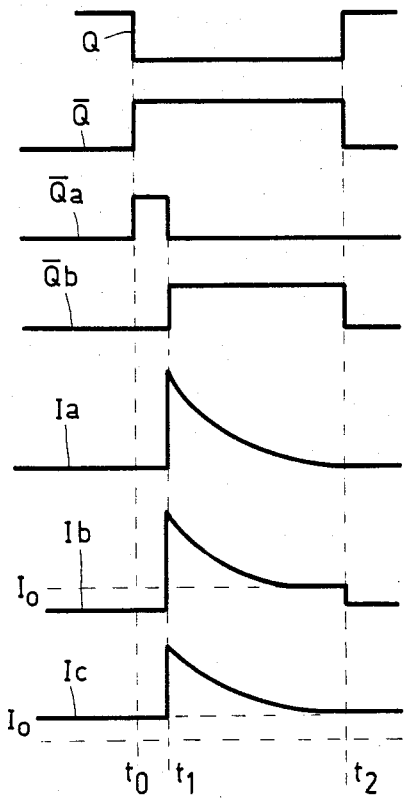

The embodiment shown in FIG. 1a is based on the dynamic amplifier circuits as inter alia described in the publication by B. J. Hosticka in Electronics Letters 1979, Vol. 15, pages 819–820 and it comprises an amplifier circuit with input transistors $T_1$ and $T_2$ arranged a differential pair, whose gate electrodes are connected to the input terminals 1 and 2. An output signal current is coupled to an output 3 by means of a current mirror comprising the transistors $T_3$ and $T_4$. A tail current is applied to the source electrodes of the transistors $T_1$ and $T_2$ by means of a transistor $T_5$, which together with a transistor $T_6$, whose drain electrode is connected to the gate electrode, is arranged as a current mirror. For biasing the amplifier the drain electrode of transistor $T_6$ is connected to the positive supply line 4 via a capacitance $C_1$. In parallel with this capacitance a switch 5 is arranged, which is switched by a signal $\overline{Q}$, and between the capacitance $C_1$ and the drain electrode of transistor $T_6$ a switch 6 is arranged, which is activated by a signal Q.

FIG. 1b represents the signals Q and $\overline{Q}$. Prior to the instant $t_1$ switch 6 is open and switch 5 is closed. Capacitance $C_1$ is then discharged. At the instant $t_1$ switch 6 is closed and switch 5 opens. Capacitance $C_1$ is then charged via transistor $T_6$, resulting in an exponentially decreasing charging current, which gives rise to to a tail current I of the differential pair, which current is represented as the current $I_a$ in FIG. 1b. After some time the current $I_a$ has decreased so far that the differential pair $T_1$, $T_2$ can no longer operate as an amplifier. From this instant the circuit comprising such a dynamic amplifier becomes highly susceptible to interference such as clock crosstalk and capacitive signal transfer. If an output circuit, for example the input capacitance of a following stage, is arranged to be floating between two outputs 3 of two dynamic amplifiers as shown in FIG. 1a, this will give rise to problems because the two amplifiers are not turned off simultaneously. Increasing the initial current $I_a$ (at instant $t_1$) is not a remedy, because taking into account the exponential relationship between the initial value and the final value and various parameter spreads, such as the value of the capacitance $C_1$ and the impedance value of the transistor $T_6$, and taking into account the minimum clock frequency, i.e. the maximum duration of the period $t_1-t_2$, said initial current value would have to be extremely high and the final value of the current is undefined and in many cases higher than desirable.

According to the invention this problem can be solved by arranging a current source in parallel with capacitance $C_1$, which in the circuit shown in FIG. 1a is formed by a transistor $T_7$ having its gate and drain electrodes interconnected. The resulting tail current I is then represented by $I_b$ in FIG. 1b, transistor $T_7$ defining the minimum value of the current $I_b$ at the instant $t_2$. At this instant $t_2$ switch 6 is opened and the current I ceases. For various uses, as in the circuit shown in FIG. 1c, or when the circuit remains susceptible to interference after the instant $t_2$, it may be desirable to keep the amplifier operative after the instant $t_2$ (and before the instant $t_1$) by providing a minimum bias current. This may inter alia be achieved by connecting the source electrode of transistor $T_7$ to the other side of switch 6 as represented by broken lines in FIG. 1a. The current $I_o$ supplied by transistor $T_7$ is then sustained after the instant $t_2$, as represented by $I_c$ in FIG. 1b.

Instead of arranging the current source ($T_7$) in the input circuit of the current mirror $T_5$, $T_6$, this source may be arranged at other locations, such as between the source electrodes of the differential pair $T_1$, $T_2$ and the negative power supply line 10, which is represented by the source 7 in FIG. 1a.

In the circuit shown in FIG. 1a the amplifier is actuated during the phase Q by, for example, reading out a capacitive signal source, for example, present in switched capacitance filters. During the phase $\overline{Q}$ the amplifier is not active and it may be set to a minimum bias current $I_o$. In specific cases it may occur that, for example by the alternate connection to different input signal sources, the amplifier could be active in both phases Q and $\overline{Q}$. The exponentially decreasing bias current would then be available in both phases. This can be achieved by extending the input circuit of the current mirror $T_5$, $T_6$, as indicated in FIG. 1c. In this extended circuit a second capacitance $C_2$ in series with a switch 8, which is switched by the signal $\overline{Q}$, is arranged between the drain electrodes of transistor $T_6$ and the positive power supply line 4. In parallel with the capacitance $C_2$ a switch 9 is arranged, which switch is switched by the signal Q. During the phase Q (between the instants $t_1$ and $t_2$ in FIG. 1b), in which capacitor $C_1$ provides the bias current for the differential pair $T_1$, $T_2$, capacitance $C_2$ is short-circuited by the switch 9. At the instant $t_2$ switch 9 is opened and switch 8 is closed, while switch 6 opens. During the phase $\overline{Q}$ capacitance $C_2$ provides the bias current for the differential pair $T_1$, $T_2$, so that also during this phase $\overline{Q}$ an exponentially decreasing bias current is obtained. This bias current is represented in FIG. 1b by the characteristic $I_d$. The constant bias current $I_o$ is then supplied by transistor $T_7$ during both phases Q and $\overline{Q}$ since transistor $T_7$ is connected to the drain electrode of transistor $T_6$.

FIG. 2a shows an embodiment of a dynamic amplifier circuit in accordance with the invention, which embodiment is based on the dynamic amplifier circuit as described by Messrs. M. A. Copeland and J. M. Rabaey in Electronics Letters, 10-5-1979, Vol. 15, No. 10, pages 301–302, while FIG. 2b represents some signal waveforms to explain the operation of this dynamic amplifier circuit.

The dynamic amplifier circuit shown in FIG. 2a comprises a transistor $T_8$ in a common-source arrangement, whose gate electrode constitutes the input terminal 11. The drain electrode is connected to an output terminal 13 via a switch 12 which is switched by a signal $\overline{Q}_b$, which output terminal is connected to a positive power supply line 15 via a switch 14 which is switched by a signal $\overline{Q}_a$ and to the gate electrode of transistor $T_8$ via a capacitance $C_3$. An input circuit comprises a capacitance $C_4$, of which one side is connected to ground and of which the other side is connected to the gate electrode of transistor $T_8$ via a switch 16 which is switched by a signal $\overline{Q}$ and to a signal input 18 via a switch 17 which is switched by a signal Q.

In the period prior to the instant $t_o$ (FIG. 2b) switches 12, 14 and 16 are opened and switch 17 is closed in conformity with the signals Q, $\overline{Q}$, $\overline{Q}_a$ and $\overline{Q}_b$. Capacitor $C_4$ is then charged in accordance with a signal voltage on input 18. At instant $t_o$ switch 17 opens and switches 14 and 16 close. Via switch 14 the series arrangement of the capacitances $C_3$ and $C_4$ is then charged to the supply voltage, the charge distribution between the capacitances $C_3$ and $C_4$ being determined by the amount of charge supplied to the capacitor $C_4$ prior to the instant $t_o$. At instant $t_1$ switch 14 opens and switch 12 closes. Capacitances $C_3$ and $C_4$ are then discharged via the drain-source path of transistor $T_8$, which capacitances then serve as charge sources for the current through this transistor. Discharging stops at the instant that the voltage on the gate electrode of transistor $T_8$ has reached the threshold voltage of this transistor. The residual charge across capacitor $C_3$ then depends on said initial charge distribution and consequently on the signal on input 11 and it determines the output voltage on output 13. The instant at which transistor $T_8$ is turned off depends on various parameters, so that these parameters should be selected so that discharging is effected within the period $\overline{Q}$. This results in the current I through transistor $T_8$ as represented by $I_a$ in FIG. 2b; an exponentially decreasing current which decreases to zero within the $\overline{Q}$ phase, which gives rise to the various aforementioned problems. In accordance with the invention a current source, in the present embodiment in the form of a transistor $T_9$ having its gate and drain electrodes interconnected, is arranged between output 13 and the positive power supply line 15. If this current source carries a current $I_o$, discharge stops when the current I ($I_b$ in FIG. 2b) through transistor $T_8$ has reached a value equal to $I_o$.

In order to ensure that during the Q phase a current $I_o$ is obtained through transistor $T_8$, the current source $T_9$ may be arranged between the drain electrode of transistor $T_8$ and the positive power supply line 15 instead of between output 13 and the positive power supply line 15. The current I which then flows through transistor $T_8$ is represented by $I_c$ in FIG. 2b.

Figure 3:
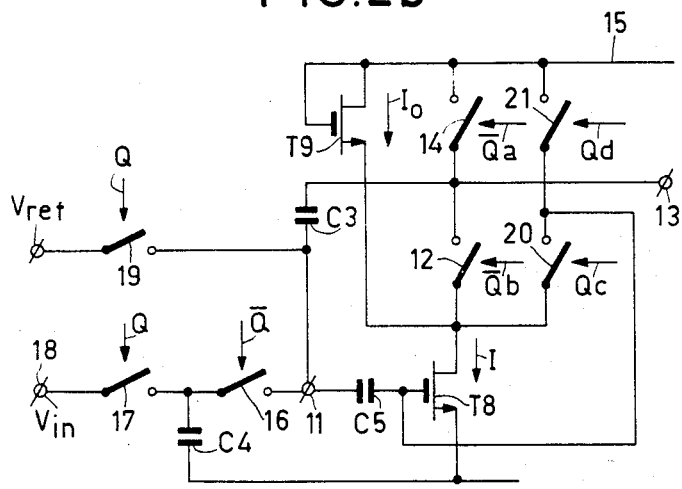
FIG. 3 shows a third embodiment of a dynamic amplifier circuit using the invention.

FIG. 3 shows a variant of the circuit shown in FIG. 2a, which also utilizes the invention. In the circuit shown in FIG. 2a the capacitance $C_4$ is charged to the input voltage $V_{in}$ during phase Q and is discharged to the threshold voltage $V_t$ of transistor $T_8$ during phase $\overline{Q}_b$, so that the charge transfer is equal to $(V_{in}-V_T) C_4$, which charge transfer is process-dependent as a result of the dependence on the threshold voltage $V_T$. As a result of the addition of the current-source transistor $T_9$, what has been said regarding the threshold voltage $V_T$ then applies to the source-gate voltage of transistor $T_8$ for the current $I_o$.

In the embodiment shown in FIG. 3, as compared with the embodiment shown in FIG. 2a, a capacitance $C_5$ is arranged between input terminal 11 and the gate electrode of transistor $T_8$. Terminal 11 is, moreover, connected to a source of reference voltage $V_{ref}$ via switch 19, which switch is switched by the signal Q. The gate electrode of transistor $T_8$ is connected to the drain electrode of transistor $T_8$ via a switch 20 which is switched by a signal $Q_c$ and to the positive power supply line 15 via a switch 21 which is controlled by a signal $Q_d$. The current-source transistor $T_9$ is arranged between the positive power supply line 15 and the drain electrode of transistor $T_8$.

During phase Q, in which capacitance $C_1$ is charged to the input voltage $V_{in}$ one side of capacitance $C_5$ is connected to the reference voltage $V_{ref}$ via switch 19. During this phase Q, switch 21 is initially closed via signal $Q_d$, so that transistor $T_8$ is turned on, and subsequently switch 20 is closed and switch 21 is opened, so that that side of the capacitance $C_5$ which is connected to the gate electrode of transistor $T_8$ assumes a voltage $V_o$ by discharging this capacitance via transistor $T_8$, which voltage is the gate-source voltage of transistor $T_1$ at the current $I_o$. At the beginning of phase $\overline{Q}$, capacitance $C_5$ then carries a voltage $V_{ref}-V_o$. During phase $\overline{Q}$ the situation is the same as in the circuit shown in FIG. 2a with the additional feature that between capacitance $C_4$ and the gate electrode of transistor $T_8$ a capacitance charged to a voltage $(V_{ref}-V_o)$ is present. During phase $\overline{Q}$, discharging of capacitance $C_4$ continues until the gate electrode of transistor $T_8$ carries the voltage $V_o$ corresponding to the current $I_o$, at which voltage the voltage across capacitance $C_4$ is equal to the reference voltage $V_{ref}$. As a result of this, the charge transfer via capacitance $C_4$ has become independent of the process-dependent voltage $V_o$.

The reference voltage $V_{ref}$ may alternatively be a signal voltage. In that case the circuit may be constructed as a differential integrator.

What is claimed is:

1. A dynamic amplifier circuit for amplifying a signal in a first time interval under control of a clock signal, which circuit comprises a bias circuit for obtaining a bias current in the amplifier circuit during said first time interval, which bias current decreases from an initial value, characterized in that the bias circuit comprises an additional source for obtaining a current in the amplifier circuit, which current is substantially constant relative to said bias current and has a comparatively small value relative to the said initial value in order to define the minimum bias current in the amplifier circuit at the end of said time interval.

2. A dynamic amplifier circuit as in claim 1, in which the bias circuit comprises a switched capacitance and means for charging said capacitance during a time interval preceding the first time interval and for discharging said capacitance during the first time interval in order to obtain the variation in said bias circuit, characterized in that a current source is provided in parallel with the circuit comprising the switched capacitance.

* * * * *